(12) United States Patent
Clark, Jr. et al.

(10) Patent No.: US 8,692,291 B2
(45) Date of Patent: Apr. 8, 2014

(54) PASSIVE DEVICES FOR FINFET INTEGRATED CIRCUIT TECHNOLOGIES

(75) Inventors: William F. Clark, Jr., Essex Junction, VT (US); Robert J. Gauthier, Jr., Hinesburg, VT (US); Junjun Li, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 13/431,456

(22) Filed: Mar. 27, 2012

(65) Prior Publication Data
US 2013/0256749 A1   Oct. 3, 2013

(51) Int. Cl.
*H01L 29/66* (2006.01)

(52) U.S. Cl.
USPC .... 257/173; 257/516; 257/528; 257/E27.009; 438/135; 438/171; 438/190; 438/210; 438/238; 438/329; 438/381

(58) Field of Classification Search
USPC .......... 257/E27.009, 173, 516, 528; 438/135, 438/171, 190, 210, 238, 329, 381
See application file for complete search history.

(56) References Cited

U.S. PATENT DOCUMENTS

| | | | |
|---|---|---|---|
| 5,773,864 A | 6/1998 | Merrill | |
| 6,737,311 B2 | 5/2004 | Desko et al. | |
| 6,949,768 B1 | 9/2005 | Anderson et al. | |
| 7,173,310 B2 | 2/2007 | Voldman et al. | |
| 7,368,354 B2 | 5/2008 | Anderson et al. | |
| 7,538,351 B2 | 5/2009 | Chen et al. | |
| 7,564,105 B2 | 7/2009 | Chi et al. | |
| 7,575,975 B2 | 8/2009 | Thean et al. | |
| 7,646,046 B2 | 1/2010 | Russ et al. | |
| 7,772,656 B2 | 8/2010 | Anderson et al. | |
| 7,851,276 B2 | 12/2010 | Yang et al. | |
| 7,879,660 B2 | 2/2011 | Booth, Jr. et al. | |
| 7,923,266 B2 | 4/2011 | Thijs et al. | |
| 7,964,893 B2 | 6/2011 | Lee | |
| 2005/0263831 A1 | 12/2005 | Doris et al. | |
| 2006/0084212 A1 | 4/2006 | Anderson et al. | |
| 2006/0240607 A1 | 10/2006 | Zhang et al. | |

(Continued)

FOREIGN PATENT DOCUMENTS

| | | |
|---|---|---|
| CN | 101814525 A | 8/2010 |
| DE | 102006022105 A1 | 11/2007 |

OTHER PUBLICATIONS

International Searching Authority, International Search Report and Written Opinion issued in International application No. PCT/US13/28965 dated May 31, 2013.

*Primary Examiner* — Asok K Sarkar
(74) *Attorney, Agent, or Firm* — Wood, Herron & Evans LLP; Anthony Canale

(57) ABSTRACT

Device structures, design structures, and fabrication methods for passive devices that may be used as electrostatic discharge protection devices in fin-type field-effect transistor integrated circuit technologies. A device structure is formed that includes a well of a first conductivity type in a device region and a doped region of a second conductivity in the well. The device region is comprised of a portion of a device layer of a semiconductor-on-insulator substrate. The doped region and a first portion of the well define a junction. A second portion of the well is positioned between the doped region and an exterior sidewall of the device region. Another portion of the device layer may be patterned to form fins for fin-type field-effect transistors.

23 Claims, 8 Drawing Sheets

(56) References Cited

U.S. PATENT DOCUMENTS

| | | |
|---|---|---|
| 2007/0262386 A1 | 11/2007 | Gossner et al. |
| 2007/0267700 A1 | 11/2007 | Russ et al. |
| 2008/0105932 A1 | 5/2008 | Liaw |
| 2008/0111163 A1 | 5/2008 | Russ et al. |
| 2008/0142806 A1 | 6/2008 | Anderson et al. |
| 2009/0280582 A1 | 11/2009 | Thijs et al. |
| 2009/0309167 A1 | 12/2009 | Russ et al. |
| 2010/0155776 A1 | 6/2010 | Lee |
| 2010/0267212 A1* | 10/2010 | Morris .......................... 438/275 |
| 2010/0296213 A1 | 11/2010 | Lee et al. |
| 2011/0115023 A1 | 5/2011 | Cheng et al. |
| 2011/0204443 A1 | 8/2011 | Iyer et al. |
| 2011/0291166 A1 | 12/2011 | Booth, Jr. et al. |
| 2012/0043597 A1 | 2/2012 | Chen et al. |
| 2012/0286331 A1 | 11/2012 | Aton et al. |

\* cited by examiner

PASSIVE DEVICES FOR FINFET INTEGRATED CIRCUIT TECHNOLOGIES

BACKGROUND

The present invention relates to semiconductor device fabrication and, more specifically, to passive devices for fin-type field-effect transistor (FinFET) integrated circuit technologies, design structures for passive devices for use in FinFET integrated circuit technologies, and methods of fabricating passive devices for use in FinFET integrated circuit technologies.

A chip may be exposed to random electrostatic discharge (ESD) events that can direct potentially large and damaging ESD currents to the integrated circuits of the chip. Manufacturers, assemblers, and users of chips often take precautions to avoid causing ESD events or to militate against the effect of an ESD event. One such precaution is to incorporate an ESD prevention circuit into the chip. The ESD protection circuit prevents damage to the sensitive devices of the integrated circuits during post-manufacture handling. The ESD protection circuit may also function to protect the integrated circuits while the chip is installed on a circuit board or other carrier.

In the absence of an ESD event, the ESD protection circuit maintains an ESD protection device in a high-impedance, non-conductive state in which the ESD protection device is electrically isolated from the protected internal circuits. If an ESD event occurs, the ESD protection device is triggered by the ESD protection circuit to change from its non-conductive state to a low-impedance, conductive state. In its conductive state, the ESD protection device directs the ESD current to ground and away from the sensitive devices in the integrated circuits on the chip. The ESD protection device clamps the ESD protection device in its conductive state until the ESD current is drained and the ESD voltage is discharged to an acceptable level.

FinFETs are non-planar devices for use in an integrated circuit of a chip that are capable of being more densely packed than traditional planar complementary metal-oxide-semiconductor (CMOS) transistors. In addition, a FinFET also offers superior short channel scalability, reduced threshold voltage swing, higher mobility, and the ability to operate at lower supply voltages than traditional planar CMOS transistors. Each FinFET features a narrow vertical fin of semiconductor material and a gate electrode that intersects a central channel of the fin. A thin gate dielectric layer separates the gate electrode from the fin. Heavily-doped source and drain regions are formed at opposite ends of the fin and border the central channel.

Improved device structures, fabrication methods, and design structures are needed for passive devices in FinFET integrated circuit technologies.

SUMMARY

According to one embodiment of the present invention, a device structure includes a well of a first conductivity type in a device region and a doped region of a second conductivity in the well. The device region is comprised of a first portion of a device layer of a semiconductor-on-insulator substrate. The doped region and a first portion of the well define a junction. A second portion of the well is positioned between the doped region and an exterior sidewall of the device region.

According to another embodiment of the present invention, a method is provided for fabricating a device structure. The method includes patterning a portion of a device layer of a semiconductor-on-insulator substrate to form a device region, forming a well of a first conductivity type in the device region, and forming a first doped region of a second conductivity type in the well to define a junction with a first portion of the well. A second portion of the well is positioned between the first doped region and an exterior sidewall of the device region.

According to another embodiment of the present invention, a design structure is provided that is readable by a machine used in design, manufacture, or simulation of an integrated circuit. The design structure includes a well of a first conductivity type in a device region and a doped region of a second conductivity in the well. The device region is comprised of a first portion of a device layer of a semiconductor-on-insulator substrate. The doped region and a first portion of the well define a junction. A second portion of the well is positioned between the doped region and an exterior sidewall of the device region. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
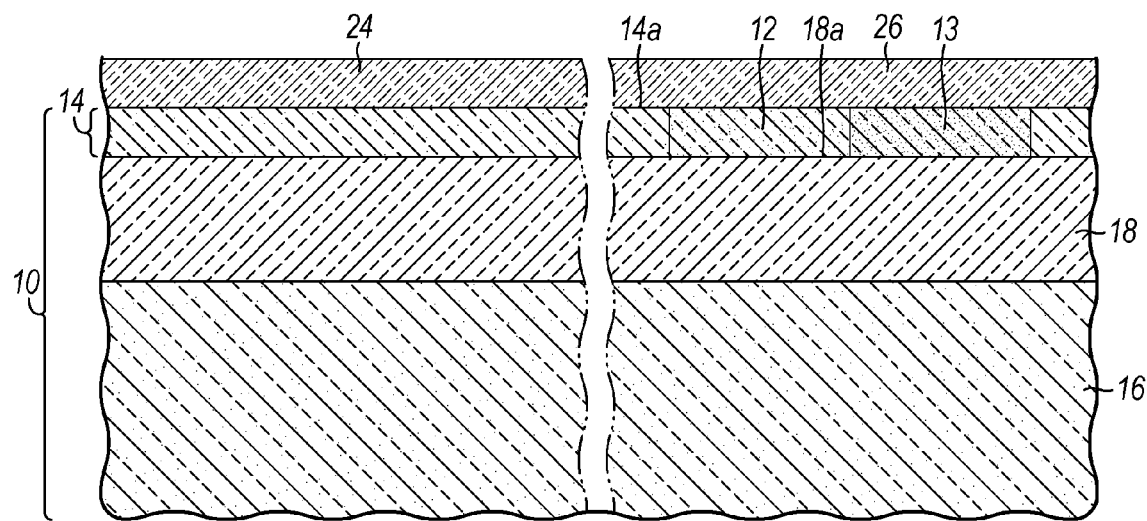
FIGS. 1-4 are cross-sectional views of different portions of a substrate at successive fabrication stages of a processing method for forming one or more FinFETs and a passive device in accordance with an embodiment of the invention.

With reference to FIG. 1 and in accordance with an embodiment of the invention, a semiconductor-on-insulator (SOI) substrate 10 for use in constructing a passive device includes a device layer 14, a handle wafer 16, and a buried insulator layer 18 comprised of an electrical insulator. The buried insulator layer 18 may be a buried oxide layer comprised of silicon dioxide (e.g., $SiO_2$). The device layer 14 is separated from the handle wafer 16 by the intervening buried insulator layer 18 and is in direct contact along a planar interface with a top surface 18a of the buried insulator layer 18. The handle wafer 16 and device layer 14 may be comprised of single crystal or monocrystalline semiconductor material, such as single crystal silicon or another crystalline semiconductor material that contains primarily silicon. The device layer 14, which may be comprised of device-quality semiconductor material, may have a thickness ranging from two (2) nm to 150 nm. The buried insulator layer 18 electrically insulates the handle wafer 16 from the device layer 14, which is considerably thinner than the handle wafer 16. The SOI substrate 10 may be fabricated by any suitable conventional technique, such as wafer bonding techniques or separation by implantation of oxygen (SIMOX) techniques, familiar to a person having ordinary skill in the art.

Doped regions 12, 13 may be formed as semiconductor material of opposite conductivity types in the device layer 14. In the representative embodiment, the doped regions 12, 13 comprised wells that are adjacent to each other in a juxtaposed relationship and that are localized in the device layer 14. Each of the doped regions 12, 13 may be formed by implanting ions of an impurity species into the device layer 14 in the presence of a patterned mask applied to the top surface 14a of the device layer 14. Each mask controls dopant introduction into device layer 14 during implantation by stopping the implanted ions within its thickness so that only a portion of the device layer 14 is doped to form the doped regions 12, 13. Each mask may be a resist layer having a window aligned with the intended location of one or the other of the doped regions 12, 13 and formed in the mask using a photolithographic patterning process. The implantation conditions (e.g., kinetic energy and dose) are selected to form each of the doped regions 12, 13 with a desired doping concentration (e.g., light doping). In a representative embodiment, the doped region 13 may be a lightly-doped n-well with the constituent semiconductor material having an n-type conductivity supplied by implanting ions of an impurity species from Group V of the Periodic Table (e.g., phosphorus (P), arsenic (As), or antimony (Sb)) and the doped region 12 may be a lightly-doped p-well with the constituent semiconductor material having a p-type conductivity supplied by implanting ions of an impurity species from Group III of the Periodic Table (e.g., boron (B), aluminum (Al), gallium (Ga), or indium (In)). After ion each implantation is complete, each respective mask is removed by, for example, oxygen plasma ashing or wet chemical stripping.

The doped regions 12, 13 are comprised of lightly-doped semiconductor material of opposite conductivity types. As used herein, the dopant concentration in semiconductor material that is considered heavily doped may be at least an order of magnitude higher than the dopant concentration in semiconductor material that is considered lightly doped. The relative dopant concentrations for heavily-doped semiconductor material and lightly-doped semiconductor material are understood by a person having ordinary skill in the art. For example, a representative dopant concentration for heavily-doped semiconductor material may be greater than or equal to $10^{18}$ cm$^{-3}$, and a representative dopant concentration for lightly-doped semiconductor material may be less than or equal to $10^{16}$ cm$^{-3}$.

Figure 2:
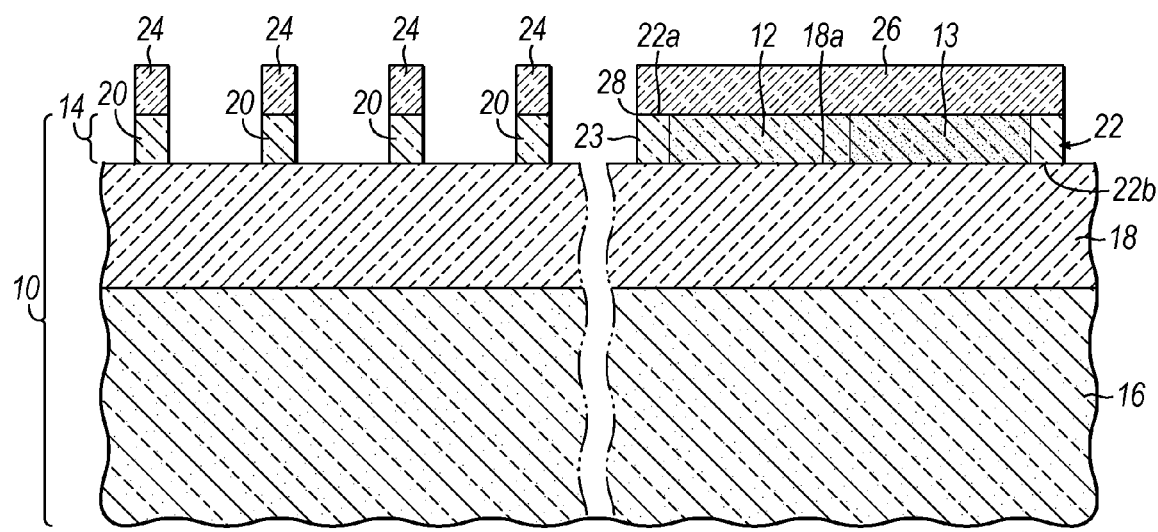

With reference to FIG. 2 in which like reference numerals refer to like features in FIG. 1 and at a subsequent fabrication stage, a plurality of fins 20 for constructing one or more fin-type field-effect transistors (FinFETs) and a device region 22 used to construct a passive device are formed from the device layer 14 of the SOI substrate 10. The fins 20 and the device region 22 have nominally equal thicknesses and are covered by respective dielectric caps 24, 26. In one embodiment, the dielectric caps 24, 26 may be comprised of SiO$_2$. The fins 20 and the device region 22, as well as dielectric caps 24, 26, may be formed by photolithography and subtractive etching processes. To that end, the unpatterned device layer 14 is covered by a layer of a suitable cap material that etches selectively to (i.e., at a higher etch rate than) the semiconductor material comprising the device layer 14. The cap material layer may be, for example, SiO$_2$ grown by thermally oxidizing the device layer 14 with a wet or dry oxidation process. The dielectric caps 24, 26 are comprised of respective portions of the cap material layer.

The fins 20 may be formed using, for example, a sidewall image transfer (SIT) process. A layer of a sacrificial material, such as polysilicon, is deposited on the top surface of the cap material layer. The sacrificial material layer is patterned to define mandrels in the region of the device layer 14 used to form the fins 20. Spacers are then formed on the sidewalls of the mandrels. The mandrels are arranged such that the spacers are formed at the intended locations for the fins 20. The spacers may be formed from a sacrificial material that is shaped by an anisotropic etching process, such as RIE, that preferentially removes the dielectric material from horizontal surfaces. The sacrificial material used to form the spacers may comprise, for example, silicon nitride (Si$_3$N$_4$) conformally deposited by chemical vapor deposition (CVD). The mandrels are then selectively removed relative to the spacers using an etching process, such as RIE. The cap material layer and the device layer 14 are patterned with an etching process, such as RIE, using one or more etching chemistries while each spacer operates as an individual etch mask for one of the fins 20 and its dielectric cap 24. The etching process stops on the top surface 18a of the buried insulator layer 18. The spacers are removed from their respective locations atop the dielectric caps 24.

Each of fins 20 is constituted by a three-dimensional block of semiconductor material originating from the device layer 14 and each of the fins 20 is covered by one of the dielectric caps 24. Each of the fins 20 has a bottom surface that is in direct contact with a top surface 18a of the buried insulator layer 18.

During the SIT process forming the fins 20, a resist mask is applied to cover the device region 22 and the overlying cap material layer. After the SIT process is completed, the resist mask is removed, and the device layer 14 and cap material layer are then patterned with photolithography and subtractive etching processes to form the device region 22 that includes the doped regions 12, 13. In one embodiment, a resist layer is applied on the cap material layer by spin coating, pre-baked, exposed to radiation projected through a photomask to impart a latent image of a window that exposes the device layer 14 at the intended location of device region 22, and then developed with a chemical developer. The resist layer supplies a protective block mask covering the fins 20. The device region 22 and dielectric cap 26 may be formed by an etching process, such as reactive ion etching (RIE), that uses one or more etching chemistries to pattern the cap material layer and device layer 14 and that relies on the patterned resist layer as an etch mask. The etching process stops on the top surface 18a of the buried insulator layer 18. The resist layer is subsequently removed by, for example, oxygen plasma ashing or wet chemical stripping.

The device region 22 is comprised of semiconductor material originating from the device layer 14 and is covered by the dielectric cap 26 comprised of insulator from the cap material layer. Specifically, the device region 22 is constituted by a three-dimensional block of the semiconductor material of the device layer 14. The device region 22 has a top surface 22a, a bottom surface 22b that contacts the top surface 18a of the buried insulator layer 18, and exterior sidewalls 23 extending between the top and bottom surfaces 22a, 22b and encircling the device region 22 as an outer boundary. A corner 28, which represents an exterior corner at an outer perimeter of the top surface 22a, is defined at the intersection between the sidewalls 23 and top surface 22a.

Figure 3:
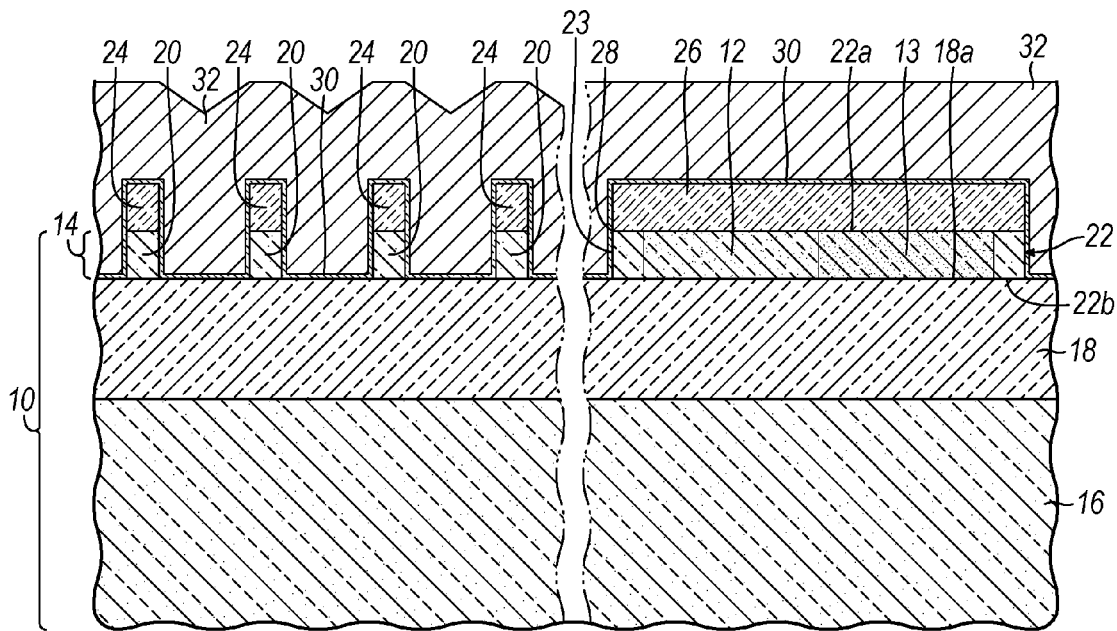

With reference to FIG. 3 in which like reference numerals refer to like features in FIG. 2 and at a subsequent fabrication stage, a gate dielectric layer 30 and a conductor layer 32 are applied across the SOI substrate 10. The conductor layer 32 is used in a subsequent fabrication stage of the processing method to form a mask used during the doping of the device region 22 to form the passive device structure. The conductor layer 32 is also used in the same subsequent fabrication stage to form one or more gates for the fins 20.

The gate dielectric layer 30 is comprised of an electrical insulator that has a dielectric constant (e.g., permittivity) characteristic of a dielectric material. In one embodiment, the gate dielectric layer 30 may be comprised of a high dielectric constant material with a relative permittivity (i.e., dielectric constant) above ten (10), which may include but are not limited to a metal oxide such as aluminum oxide ($Al_2O_3$), zirconium oxide ($ZrO_2$), tantalum pentoxide ($Ta_2O_5$), or hafnium oxide ($HfO_2$), a metal silicate such as a hafnium silicate ($HfSiO_4$) or hafnium oxynitride (HfSiON), or layered stacks of these and other similar materials. These types of electrical insulators may be deposited by atomic layer deposition (ALD), CVD, or another deposition technique. The conductor layer 32 is comprised of one or more layers of a material characterized by a high electrical conductivity. For example, the conductor layer 32 may be comprised of poly-crystalline silicon (e.g., polysilicon) deposited by LPCVD or physical vapor deposition (PVD).

Figure 4:
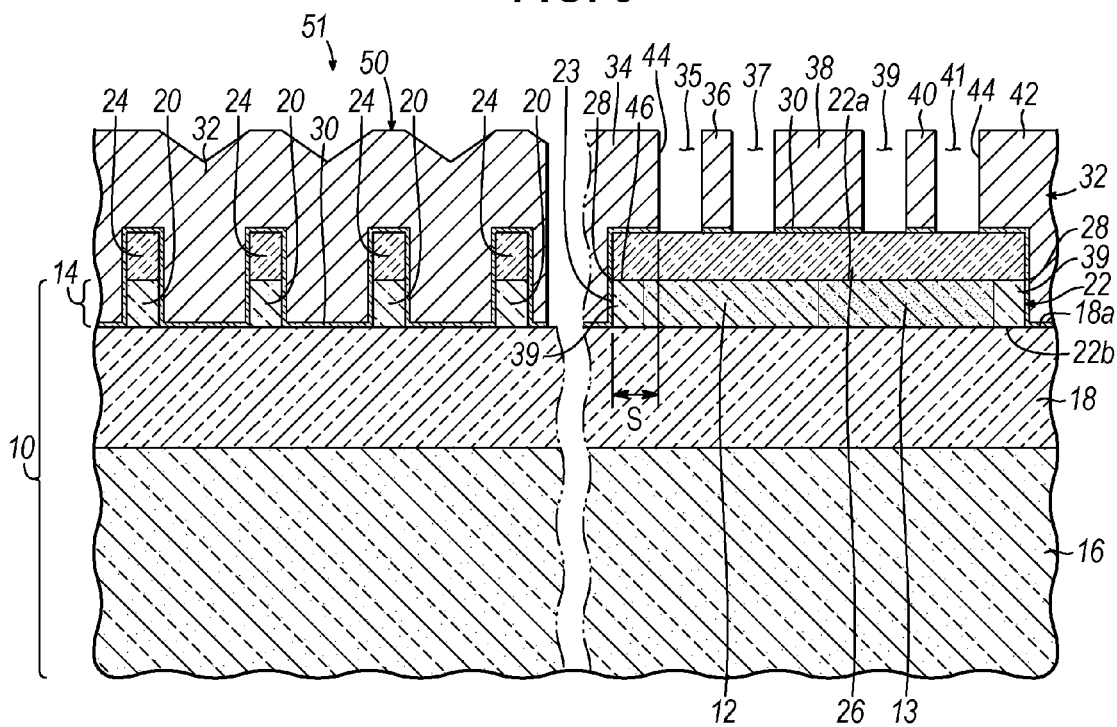
Figure 4A:
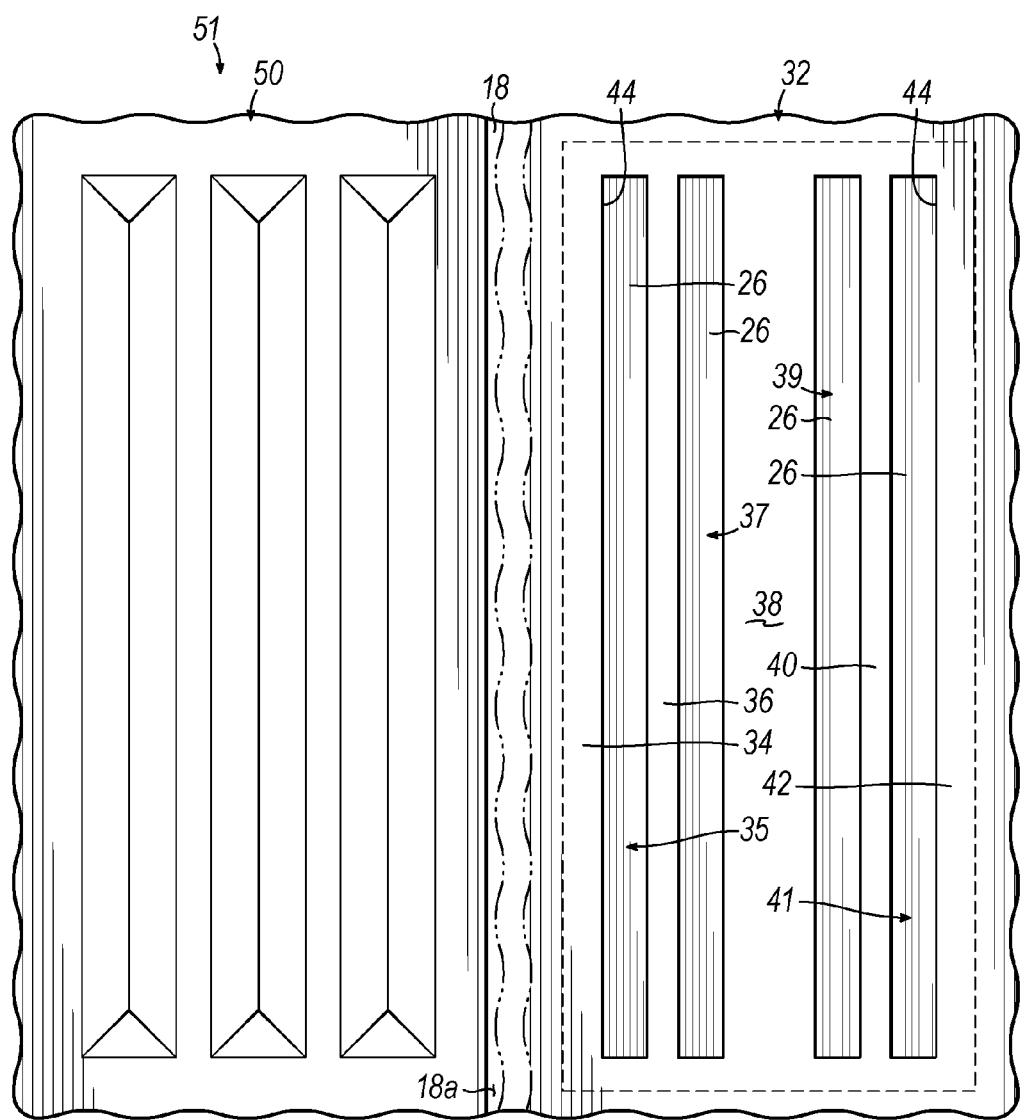
FIG. 4A is a top view of FIG. 4.

With reference to FIGS. 4, 4A in which like reference numerals refer to like features in FIG. 3 and at a subsequent fabrication stage, the gate dielectric layer 30 and conductor layer 32 are patterned to form a sacrificial mask layer including a plurality of strips 34, 36, 38, 40, 42 that coincide with the location of the device region 22. The strips 34, 42, in combination with sacrificial masks described hereinbelow, define edges of an exterior sidewall 44 that establishes an outer perimeter for formation of the various heavily-doped regions defining the device structure for the passive device formed using the device region 22. The exterior sidewall 44 is inset inside of the exterior sidewalls 23 and corner 28 of the device region 22 so that the conductor layer 32, gate dielectric layer 30, and dielectric cap 26 overlap the device region 22 by a distance, S, and cover a peripheral edge 46 on the top surface 22a. The arrangement of strips 34, 36, 38, 40, 42 defines openings 35, 37, 39, 41 that expose correlated strips on the top surface 22a of the device region 22.

The openings 35, 37, 39, 41 may be utilized to form heavily-doped regions of semiconductor material in the device region 22. Strip 34 partially overlaps with the doped region 12 and the overlapped portion underlies the peripheral edge 46. Strip 42 partially overlaps with the doped region 13 and the overlapped portion underlies the peripheral edge 46. These overlapping relationships operate in the final device structure to position lightly-doped semiconductor material between the sidewalls 23 and corner 28 of the device region 22 and the more heavily-doped regions subsequently defined using the openings 35, 37, 39, 41. In particular, the junction structures defined by the heavily-doped regions may be characterized as gate-bound junction structures in that the strips 34, 36, 38, 40, 42 of a gate stack provide implant alignment for the heavily-doped regions and may subsequently function to block silicide formation when contacts to the heavily-doped regions are formed.

In the representative embodiment, the patterning of the conductor layer 32 also forms a gate 50 for a FinFET 51, which is a single non-planar device structure constructed with multiple fins 20. The gate 50 is electrically insulated from the fins 20 by the gate dielectric layer 30 in a gate stack. Alternatively, the gate dielectric layer 30 and conductor layer 32 may be patterned to define multiple FinFETs each having an individual gate stack that overlaps at least one but not all of the fins 20. Additional FinFETs like FinFET 51 may be formed using fins similar to fins 20 in order to fabricate a FinFET-based integrated circuit on the SOI substrate 10.

In an alternative embodiment, the gate dielectric layer 30 and conductor layer 32 may be completely removed from the device region 22 during the patterning operation and replaced by an additive mask layer that is patterned to provide the strips 34, 36, 38, 40, 42. The additive mask layer comprises a material that is deposited on the top surface 22a of the device region 22 after the gate dielectric layer 30 and conductor layer 32 are removed from the device region 22. For example, the additive mask layer may be a resist layer that is applied by spin coating, pre-baked, exposed in a lithography tool to radiation projected through a photomask to impart a latent image of the strips 34, 36, 38, 40, 42, baked, and then developed with a chemical developer. The patterned mask layer has an appearance identical or substantially identical to the patterned gate dielectric layer 30 and conductor layer 32 in FIG. 4. The mask layer may be comprised of a layer of a dielectric material and, in particular, may be comprised of a silicide blocking (sblk) material, such as a nitride, oxide, or oxynitride of silicon deposited by CVD or PVD, that is used in a CMOS process to block silicide formation. The junction structures defined by the heavily-doped regions may be characterized as sblk-bound junction structures in that the strips 34, 36, 38, 40, 42 of silicide blocking material provide implant alignment for the heavily-doped regions and may subsequently function to block silicide formation when contacts to the heavily-doped regions are formed.

Figure 5:
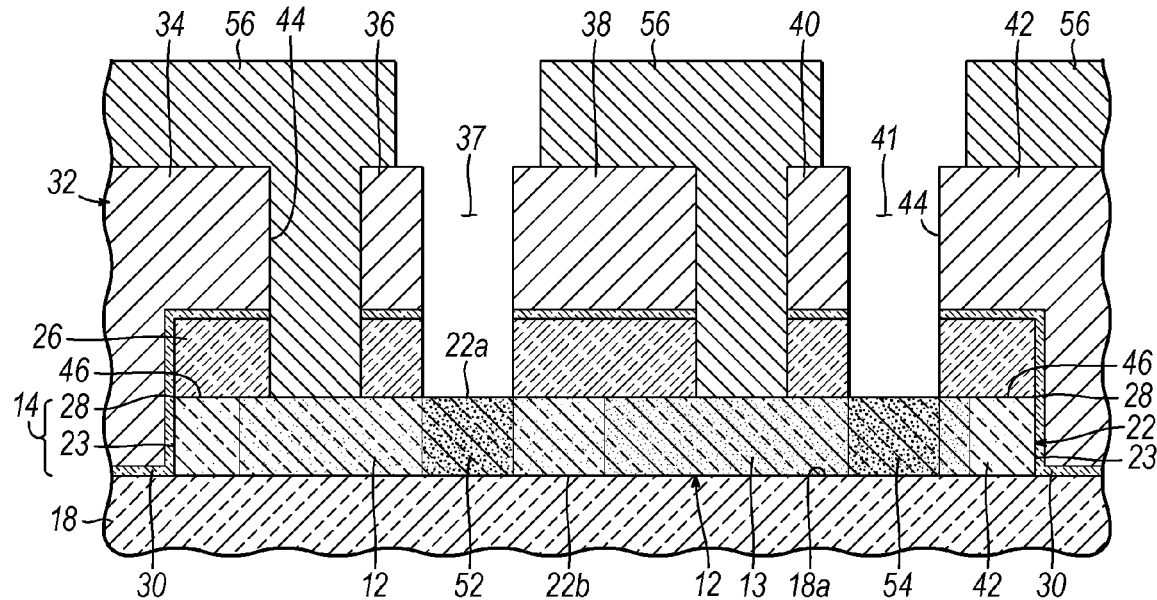
FIGS. 5-7 are cross-sectional views of the substrate portion of FIG. 4 for the passive device at successive fabrication stages of the processing method.

With reference to FIG. 5 in which like reference numerals refer to like features in FIG. 4 and at a subsequent fabrication stage, doped regions 52, 54 are formed in the device region 22 following the formation of a patterned mask 56. Doped region 52, which is laterally disposed within lightly-doped region 12, is comprised of semiconductor material having an opposite conductivity type from doped region 12. Doped region 54, which is laterally disposed within the lightly-doped region 13, is comprised of semiconductor material having the same conductivity type as doped region 13 but with a higher doping concentration and a higher electrical conductivity (i.e., lower electrical resistivity).

In the representative embodiment, the doped regions 52, 54 may be concurrently formed by ion implantation. To that end, the patterned mask 56 covers the openings 35, 39 and ions of an impurity species are implanted through openings in the mask 56 that coincide with openings 37, 41. The mask 56 may be, for example, a resist layer having openings respectively aligned with the openings 37, 41 representing the intended locations for the doped regions 52, 54 and formed using a photolithographic patterning process with a thickness sufficient to stop the implanted ions. The mask 56 and the strips 34, 42 collectively establish the sidewall 44 that is inset inside of the corner 28 of the device region 22 by the distance, S, to cover the peripheral edge 46 on the top surface 22a. The implantation conditions for forming doped regions 52, 54 are selected to provide a desired depth profile for the doping concentration and may include multiple implantation conditions. In one embodiment, the doped regions 52, 54 may be provided with n-type conductivity by implanting ions of a suitable n-type impurity species. The semiconductor material of the device region 22 aligned with openings 35, 39 does not receive a concentration of the implanted ions because of blocking by the mask 56, which stops the ions within its thickness. After ion implantation is complete, the mask 56 is removed.

Figure 6:
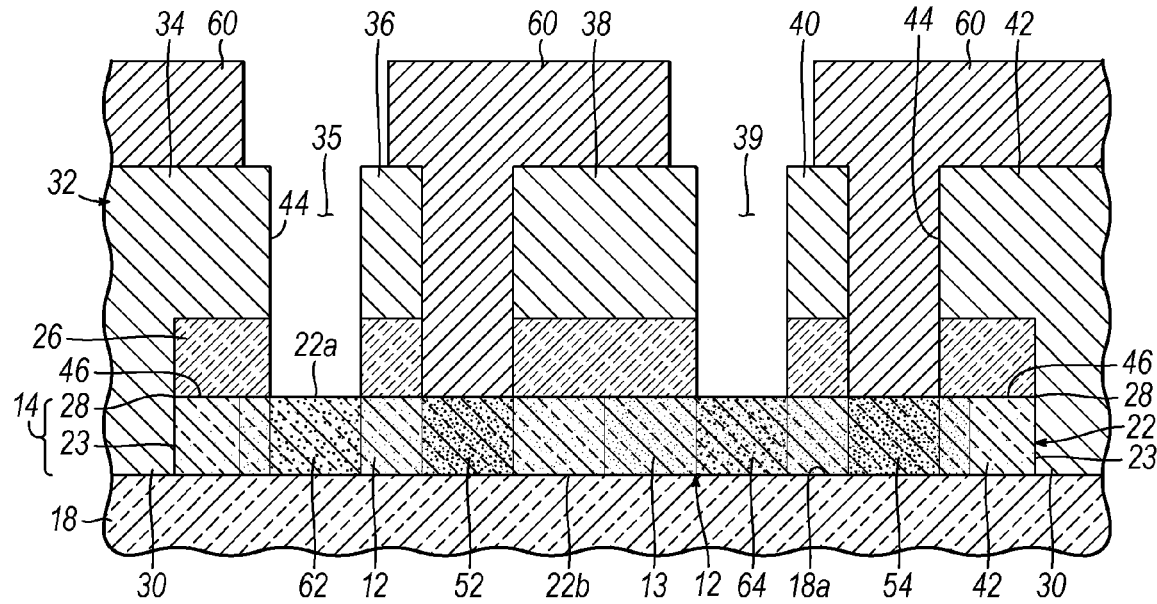

With reference to FIG. 6 in which like reference numerals refer to like features in FIG. 5 and at a subsequent fabrication stage, doped regions 62, 64 are formed in the device region 22 and may be formed either before or after the formation of doped regions 52, 54. Doped region 62, which is laterally disposed within the well defined by doped region 12, is comprised of semiconductor material having the same conductivity type as doped region 12 but with a higher doping concentration and a higher electrical conductivity (i.e., lower electrical resistivity). Doped region 64, which is laterally disposed in the well defined by the doped region 13, is comprised of semiconductor material having an opposite conductivity type from doped region 13.

In the representative embodiment, the doped regions 62, 64 may be concurrently formed by ion implantation. To that end, openings 37, 41 are covered by a patterned mask 60 and ions of an impurity species are implanted through openings in the mask 60 that coincide with openings 35, 39. The mask 60 may be, for example, a resist layer having openings respectively aligned with the openings 35, 39 representing the intended locations for the doped regions 62, 64 and formed using a photolithographic patterning process. The mask 60 and the strips 34, 42 collectively establish the sidewall 44 that is inset inside of the corner 28 of the device region 22 by the distance, S, to cover the peripheral edge 46 on the top surface 22a. The implantation conditions for forming doped regions 62, 64 are selected to provide a desired depth profile for the doping concentration and may include multiple implantation conditions. In one embodiment, the doped regions 62, 64 may be provided with p-type conductivity by implanting ions of a suitable p-type impurity species. The semiconductor material of the device region 22 aligned with openings 37, 41 does not receive a concentration of the implanted ions because of blocking by the mask 60, which stops the ions within its thickness. After ion implantation is complete, the mask 60 is removed.

In an alternative, the masks 56, 60 may be used to form the doped regions 52, 54, 62, 64 in a process flow that lacks self-alignment with a hardmask. Specifically, the gate dielectric layer 30 and conductor layer 32 may be completely removed from the device region 22 during the patterning operation and not replaced by an additive mask layer. Instead, the mask 56 is used to form doped regions 52, 54 and mask 60 is used to form doped regions 62, 64 in the absence of a hardmask. To form doped regions 52, 54, the mask 56 is patterned such that openings equivalent to openings 37, 41 are formed. The mask 56 and the strips 34, 42 collectively establish the sidewall 44 that is inset inside of the corner 28 of the device region 22 by the distance, S, to cover the peripheral edge 46 on the top surface 22a. To form doped regions 62, 64, the mask 60 is patterned such that openings equivalent to openings 35, 39 are formed. The mask 60 and the strips 34, 42 collectively establish the sidewall 44 that is inset inside of the corner 28 of the device region 22 by the distance, S, to cover the peripheral edge 46 on the top surface 22a.

Figure 7:
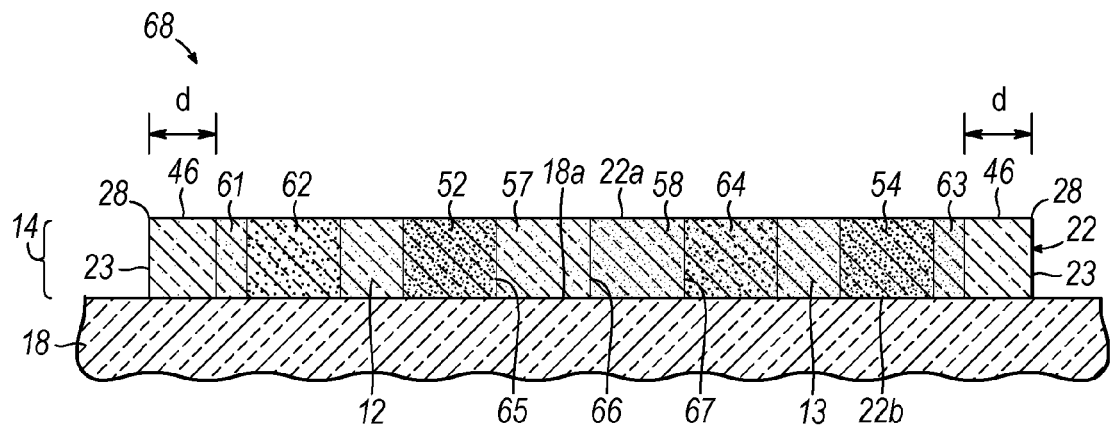
Figure 8:
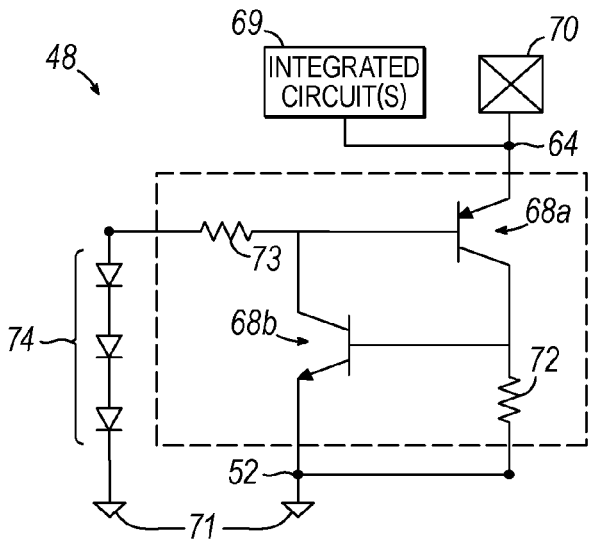
FIG. 8 is a schematic view of an electrical configuration for the device structure of FIG. 7.
Figure 7A:
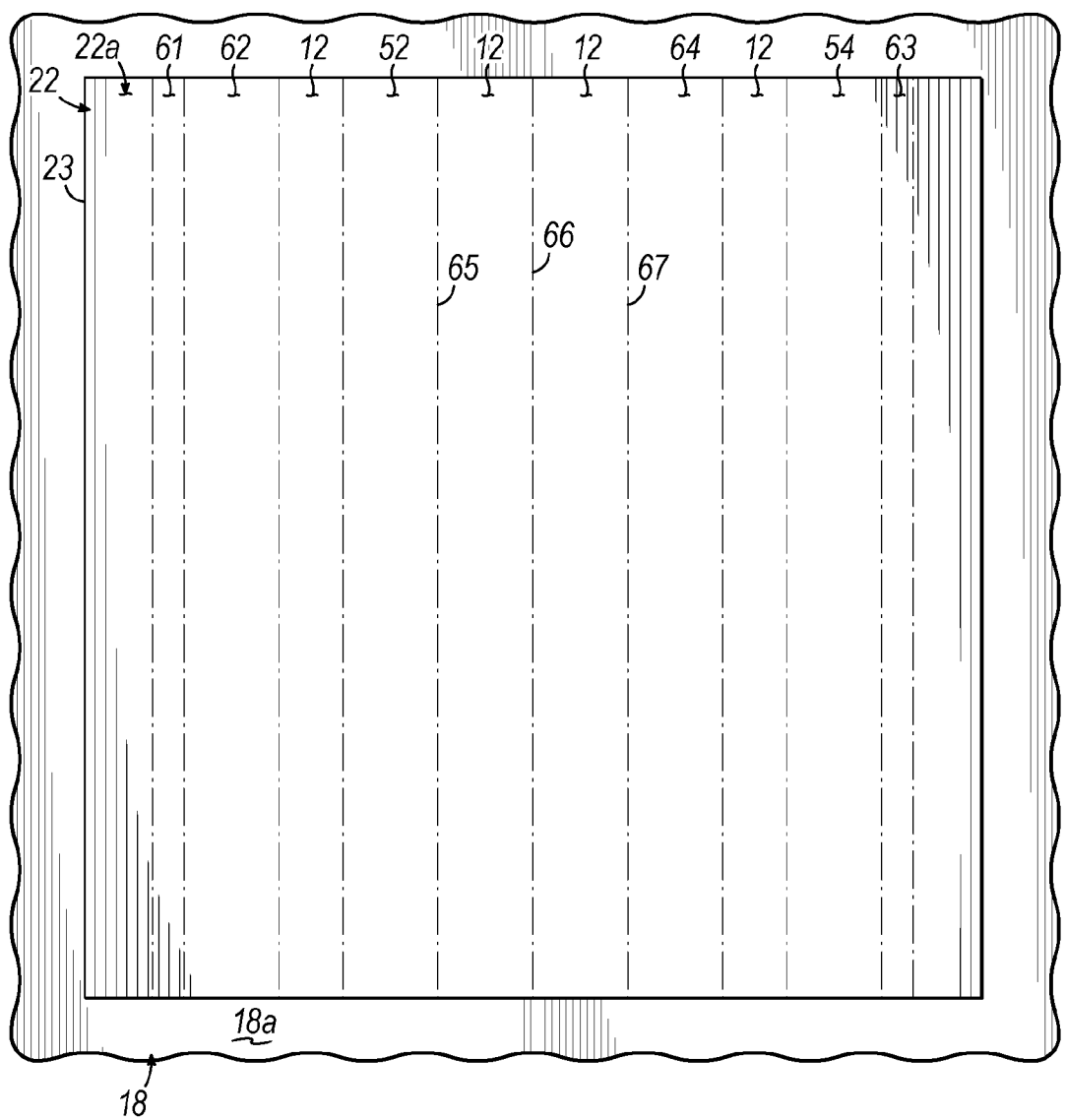
FIG. 7A is a top view of FIG. 7 showing the device structure for the passive device.

With reference to FIGS. 7, 7A, 8 in which like reference numerals refer to like features in FIGS. 5, 6 and at a subsequent fabrication stage, the strips 34, 36, 38, 40, 42 may be removed from the device region 22 by etching. The FinFET 51 is masked during the removal. The device region 22 and the doped regions 12, 13, 52, 54, 62, 64 in the device region 22 are unaffected by the etching. An anneal, such as a rapid thermal anneal, may be employed to electrically activate the implanted impurity species and to alleviate any implantation damage in doped regions 12, 13, 52, 54, 62, 64.

A passive device 68, which is a silicon controlled rectifier (SCR) in the representative embodiment, is provided as a lateral, planar four-layer structure of alternating conductivity types and three p-n junctions 65, 66, 67 across which the conductivity type of the layered semiconductor material changes. The SCR represented by the passive device 68 is comprised of cross-coupled parasitic PNP and NPN bipolar transistors 68a, 68b (FIG. 8). The p-n junction 65 is defined along an interface between doped region 52 and a portion 57 of doped region 12. This p-n junction 65 produced by the abutment of doped regions 12, 52 also represents the junction for a diode. The p-n junction 66 is defined along an interface between the portion 57 of doped region 12 and a portion 58 of doped region 13. The p-n junction 67 is defined along an interface between the portion 58 of doped region 13 and doped region 64. This p-n junction 67 produced by the abutment of doped regions 13, 64 also represents the junction for a diode.

The doped region 52 may represent a cathode of the passive device 68, and the doped region 64 may represent an anode of the passive device 68. The doped region 54 may provide another body contact, which in the representative embodiment is an n-body contact that contacts the n-well represented by doped region 13. The doped region 62 may provide a body contact, which in the representative embodiment is a p-body contact that contacts the p-well represented by doped region 12.

The passive device 68 may be used as a protection element in an electrostatic discharge (ESD) protection circuit 48 configured to discharge current from an ESD pulse or, alternatively, the passive device 68 may be used in a different type of circuit that does not involve ESD protection.

In use as a protection element in the ESD protection circuit 48, the passive device 68 and one or more protected integrated circuits 69 may be electrically coupled by a common signal path to an input/output (I/O) pad 70. More specifically, the doped region 64 (i.e., the cathode of the passive device 68) may be coupled with the I/O pad 70 and the protected integrated circuits 69 and the doped region 52 (i.e., the anode of the passive device 68) may be coupled to the ground buss at a ground pad 71, which is grounded when the protected integrated circuits 69 are not powered. The wells 12, 13 define resistances 72, 73 in the ESD protection circuit 48.

The one or more protected integrated circuits 69 may include the FinFET 51 formed using the fins 20 and other similar FinFETs. When the protected integrated circuits 69 are powered, the passive device 68 will present a high impedance between the I/O pad 70 and the ground buss at ground pad 71 so that signals communicated over the signal path between the I/O pad 70 and the integrated circuits 69 are substantially unaffected by the presence of the passive device 68.

The gate of the PNP bipolar transistor 68a is coupled with a drive circuit 74, which may be a diode string. The drive circuit 74 of the ESD protection circuit 48 responds to the voltage from an ESD pulse by triggering the passive device 68 to enter a low-impedance conducting state and thereby provide a current-carrying path for the ESD current from the I/O pad 70 to the ground pad 71. The current-carrying path includes the doped regions 52, 64 and the portions of doped regions 12, 13 between doped regions 52, 64. When triggered, the passive device 68 is induced to enter the low-impedance conducting state by the ESD pulse and thereby divert the ESD pulse through the current-carrying path and away from the protected integrated circuits 69. In response to the ESD current flowing through the passive device 68, the bipolar transistors 68a, 68b hold each other in the low-impedance conducting state and the low-impedance conducting state persists. At the conclusion of the ESD event, the passive device 68 reverts to the high-impedance non-conducting state and remains off-until a trigger signal is applied by a future ESD event to the gate of the passive device 68.

The doped regions 52, 54, 62, 64 of the passive device 68 may extend vertically in depth from the top surface 22a to the bottom surface 22b of the device region 22, which is coextensive with the top surface 18a of buried insulator layer 18. Doped region 12 includes a portion 61 that is laterally positioned between the doped region 62 and the sidewalls 23 and corner 28 of the device region 22. Doped region 13 includes a portion 63 that is laterally positioned between the doped region 54 and the sidewalls 23 and corner 28 of the device region 22.

The doped regions 52, 62, which are comprised of heavily-doped semiconductor material, are interiorly positioned inside the doped region 12 that represents a well comprised of lightly-doped semiconductor material. The doped regions 54, 64, which are also comprised of heavily-doped semiconductor material of the opposite conductivity type, are interiorly positioned inside the doped region 13 that represents a well comprised of lightly-doped semiconductor material. Specifically, the doped regions 52, 54, 62, 64 may be spaced inward from the exterior sidewalls 23 and corner 28 (i.e., the outer perimeter of the top surface 22a of device region 22) by a distance, d. In particular, the distance, d, between doped region 62 and the nearest-neighbor sidewall 23 and corner 28 is partially occupied by the portion 61 of lightly-doped region 12, and the distance, d, between doped region 54 and the nearest-neighbor sidewall 23 and corner 28 is occupied by the portion 63 of doped region 13. As a result, doped region 62 is separated from its nearest-neighbor sidewall 23 and corner 28 by lightly-doped semiconductor material of one conductivity type and doped region 54 is separated from its nearest-neighbor sidewall 23 and the corner 28 by lightly-doped semiconductor material of an opposite conductivity type.

The intentional inward spacing by distance, d, may provide spatial clearance to account for uncertainty in the physical location of the doped regions 52, 54, 62, 64. The intentional inward spacing by distance, d, may also enhance the electrical control over the passive device 68 by supplying a guard structure between the doped regions 52, 54, 62, 64 and the exterior sidewalls 23 and corner 28.

The passive device 68 is formed on the same SOI substrate 10 as the FinFET 51, and the FinFET 51 and passive device 68 both utilize semiconductor material originating from the device layer 14 in their construction. The passive device 68 is electrically isolated from the FinFET 51 by the buried insulator layer 18 and without the aid of lateral isolation structures, such as shallow trench isolation regions. Standard processing follows the formation of the passive device 68 to provide contacts to the various doped regions 52, 54, 62, 64 and a back-end-of-line (BEOL) interconnect structure.

Figure 9:
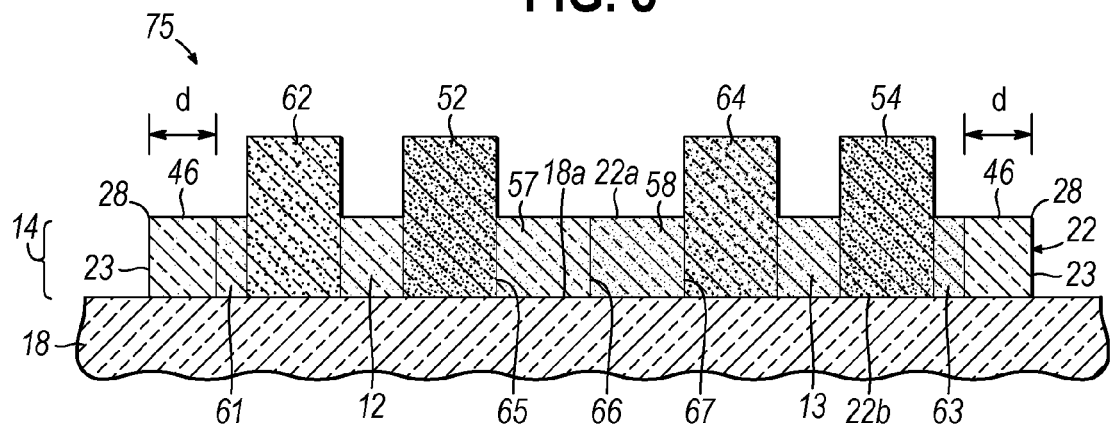
FIG. 9-11 are cross-sectional views similar to FIG. 7 of device structures for a passive device that are constructed in accordance with alternative embodiments of the invention.

With reference to FIG. 9 in which like reference numerals refer to like features in FIGS. 7, 7A and in accordance with an alternative embodiment, a passive device 75 may be formed using the device region 22 that differs from the passive device 68 (FIGS. 7, 7A). Specifically, the semiconductor material of the device region 22 is locally thickened over the surfaces areas exposed by the openings 35, 37, 39, 41 before the doped regions 52, 54, 62, 64 are formed by ion implantation. The doped regions 52, 54, 62, 64 are thereby heighted so that each is thicker than the device layer 14 and, therefore, each has a top surface that is raised or elevated relative to the top surface 22a of the device region 22. The device region 22 may be locally thickened by a process forming elevated or raised source/drain regions on the fins 20 of the FinFET 51. Specifically, an epitaxial growth process may be used to selectively deposit a layer of a semiconductor, such as silicon, to form the raised source/drain regions and to thicken the doped regions 52, 54, 62, 64.

Similar to passive device 68, the passive device 75 may be utilized as an ESD protection element in an ESD protection circuit. Alternatively, the passive device 76 may be used in a different type of circuit that does not involve ESD protection.

Figure 10:
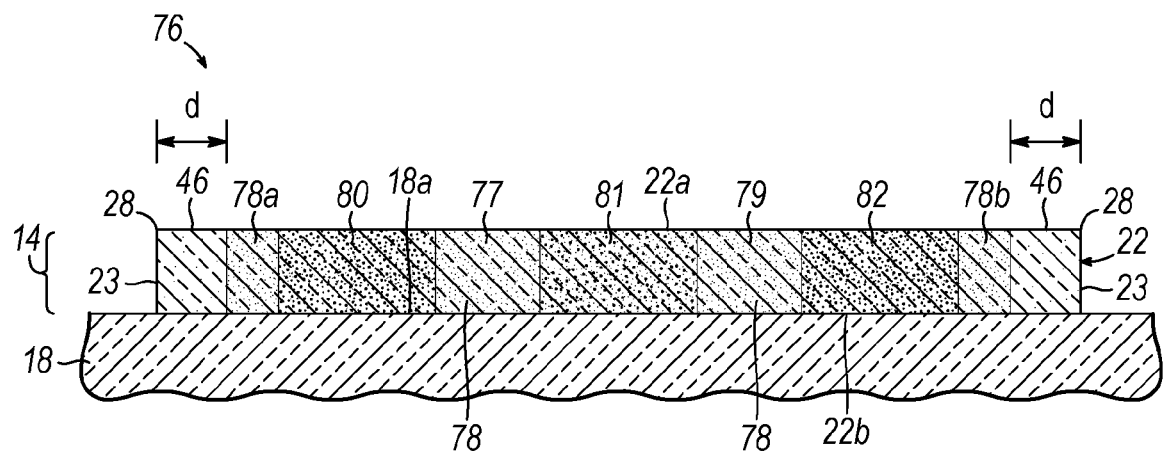

With reference to FIG. 10 in which like reference numerals refer to like features in FIGS. 7, 7A and in accordance with an alternative embodiment, a passive device 76 may be formed using the device region 22 that differs from the passive device 68 (FIGS. 7, 7A), as well as from the passive device 75 (FIG. 9). Specifically, the formation of the doped region 13 may be omitted from the process flow and the formation of the doped region 12 may be altered such that a lightly-doped region 78 analogous to doped region 12 but of larger dimensions is formed in the device region 22. As a result, the lightly-doped region 78 represents a well of a single conductivity type within the device region 22 that is used for device formation.

The process flow used to form the passive device 68 is also altered in connection with the formation of the heavily-doped regions 52, 54, 62, 64 such that only three heavily-doped regions 80, 81, 82 are formed in the device region 22 and such that each of these regions 80, 81, 82 is formed in the lightly-doped region 78. To that end, the number of strips 34, 36, 38, 40, 42 (FIGS. 5, 5A) is altered by unity to reduce the number of openings 35, 37, 39, 41 by unity so that only four strips and three openings are present. The locations and arrangement of the strips determines the location and arrangement of the doped regions 80, 81, 82.

The doped regions 80, 82 are formed by an impurity introduction process, such as ion implantation, while the intended location for doped region 81 and the remainder of doped region 78 are masked. Doped regions 80, 82 are comprised of semiconductor material having the same conductivity type as the doped region 78 and are used to supply well contacts. The doped region 81 is formed by an impurity introduction process, such as ion implantation, while the doped regions 80, 82 and the remainder of doped region 78 are masked. The doped region 81 is laterally disposed between the doped regions 80, 82. The doped region 81 is comprised of semiconductor material having the opposite conductivity type from the doped region 78.

A portion 78a of doped region 78 may be laterally positioned between doped region 80 and the nearest-neighbor sidewall 13 and corner 28 of the device region 22. A portion 78b of doped region 78 may be laterally positioned between doped region 82 and the nearest-neighbor sidewall 13 and corner 28 of the device region 22. One or both of portions 77, 79 of the doped region 78 may form a p-n junction with the doped region 81. The doped regions 80, 81, 82 may be optionally raised or elevated relative to the top surface 22a as described hereinabove for passive device 75.

The doped regions 80, 81, 82 of heavily-doped semiconductor material may be spaced inward from the sidewalls 23 and corner 28. In particular, the distance, d, between doped region 80 and the nearest-neighbor sidewall 23 and corner 28 includes the portion 78a of doped region 78, and the distance, d, between doped region 82 and the nearest-neighbor sidewall 23 and corner 28 includes the portion 78a of doped region 78. As a result, doped region 80 and the doped region 82 are each separated from its nearest-neighbor sidewall 23 and corner 50 by lightly-doped semiconductor material of one conductivity type.

In one embodiment, the doped region 78 may be comprised of lightly-doped n-type semiconductor material to define an n-well, the doped regions 80, 82 may be comprised of heavily-doped n-type semiconductor material, and the doped region 81 may be comprised of heavily-doped p-type semiconductor material. This arrangement of oppositely doped layers defines a p$^+$/n-well diode as the passive device 76. In another embodiment, the doped region 78 may be comprised of lightly-doped p-type semiconductor material to define a p-well, the doped regions 80, 82 may be comprised of heavily-doped p-type semiconductor material, and the doped region 81 may be comprised of heavily-doped n-type semiconductor material. This layered arrangement defines a lateral, planar n$^+$/p-well diode as the passive device 76. Doped region 81 serves as a cathode for both types of diodes, doped region 78 serves as an anode for both types of diodes, and the doped regions 78, 81 are butted to define a p-n junction.

Similar to passive device 68, the passive device 76 may be utilized as an ESD protection element in an ESD protection circuit. Alternatively, the passive device 76 may be used in a different type of circuit that does not involve ESD protection.

Figure 11:
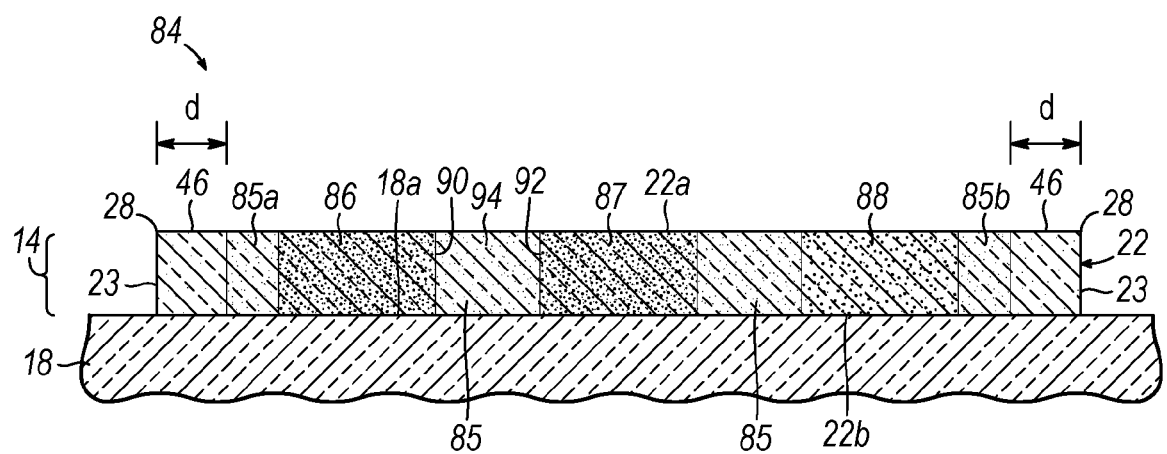

With reference to FIG. 11 in which like reference numerals refer to like features in FIGS. 7, 7A and in accordance with an alternative embodiment, a passive device 84 may be formed using the device region 22 that differs from the passive device 76 (FIG. 10), as well as from the passive device 68 (FIGS. 7, 7A) and passive device 75 (FIG. 9). Similar to the process flow forming passive device 76, the doped region 13 is omitted from the process flow and a lightly-doped region 85 analogous to lightly-doped region 12 but of larger dimensions is formed in device region 22. As a result, the lightly-doped region 85 represents a well of a single conductivity type within the device region 22 that is used for device formation.

Also similar to the process flow used to form the passive device 76, only three heavily-doped regions 86, 87, 88 are formed in the device region 22. As discussed above in connection with the formation of passive device 76, this modification is accomplished by altering the number of strips 34, 36, 38, 40, 42 (FIGS. 5, 5A) by unity to reduce the number of openings 35, 37, 39, 41 by unity so that only four strips and three openings are present. The locations and arrangement of the strips determines the location and arrangement of the doped regions 86, 87, 88.

The doped regions 86, 87 are formed by an impurity introduction process, such as ion implantation, while the intended location for doped region 88 and the remainder of doped region 85 are masked. The doped regions 86, 87 are comprised of semiconductor material having an opposite conductivity type from the lightly-doped region 85 and are laterally adjacent to each other. As a result, a p-n junction 90 is defined along an interface between a portion 94 of lightly-doped region 85 between doped regions 86, 87 and doped region 86 across which the conductivity type changes. Another p-n junction 92 is defined along an interface between the same portion 94 of lightly-doped region 85 and doped region 87 across which the conductivity type also changes.

The doped region 88 is formed by an impurity introduction process, such as ion implantation, while the doped regions 85, 87 are masked. The doped region 88 is comprised of semiconductor material having the same conductivity type as the doped region 85 and is used to supply a well contact. A portion 85a of lightly-doped region 85 may be laterally positioned between the heavily-doped region 86 and the nearest-neighbor sidewall 23 and corner 28 of the device region 22. A portion 85b of lightly-doped region 85 may be laterally positioned between the heavily-doped region 88 and the nearest-neighbor sidewall 23 and corner 28 of the device region 22. The heavily-doped regions 86, 87, 88 may be raised or elevated relative to the top surface 22a as described hereinabove for passive device 75.

The doped regions 86, 87, 88 of heavily-doped semiconductor material may be spaced inward from the sidewalls 23 and corner 28. In particular, the distance, d, between doped region 86 and the nearest-neighbor sidewall 23 and corner 28 includes the portion 85a of doped region 85, and the distance, d, between doped region 88 and the nearest-neighbor sidewall 23 and corner 28 includes the portion 85a of doped region 85. As a result, doped region 86 and the doped region 88 are each separated from its nearest-neighbor sidewall 23 and corner 50 by lightly-doped semiconductor material of one conductivity type.

In one embodiment, the doped region 85 may be comprised of lightly-doped p-type semiconductor material to define a p-well, the doped regions 86, 87 may be comprised of heavily-doped n-type semiconductor material, and the doped region 88 may be comprised of heavily-doped p-type semiconductor material. This arrangement of oppositely doped layers defines a lateral, planar NPN bipolar junction transistor as the passive device 84. The doped regions 86 and 87 define the emitter and collector of the NPN bipolar junction transistor and the portion of doped region 85 between the doped regions 86, 87 defines the base of the NPN bipolar junction transistor. The p-n junction between the n-type collector (doped region 87) and the p-type base is the collector-base junction that has the base as the anode and the collector as the cathode. The p-n junction between the n-type emitter (doped region 87) and the p-type base is the emitter-base junction that has the base as the anode and the emitter as the cathode.

In another embodiment, the doped region 85 may be comprised of lightly-doped n-type semiconductor material to define a p-well, the doped regions 86, 87 may be comprised of heavily-doped p-type semiconductor material, and the doped region 88 may be comprised of heavily-doped n-type semiconductor material. This arrangement of oppositely doped layers defines a lateral, planar PNP bipolar junction as the passive device 84.

Similar to passive devices 68, 75, 76, the passive device 84 may be employed as an ESD protection element in an ESD protection circuit. Alternatively, the passive device 84 may be used in a different type of circuit that does not involve ESD protection.

Figure 12:
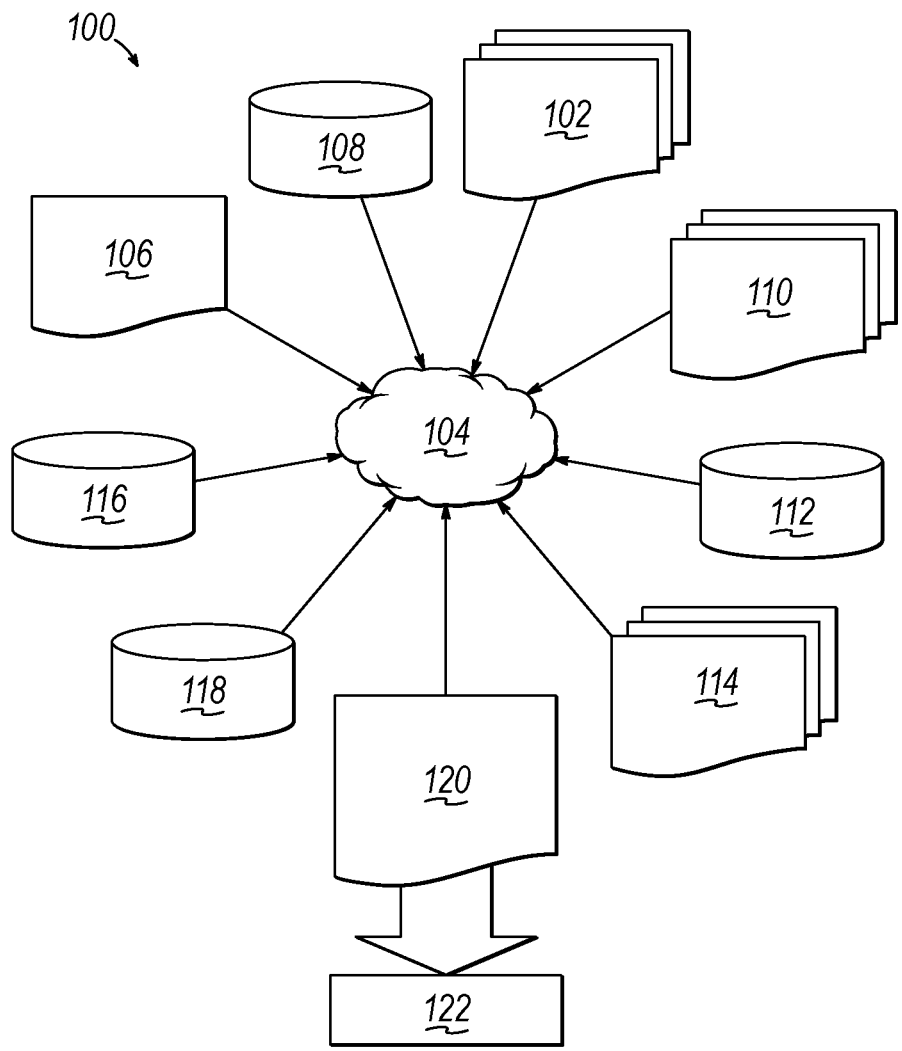
FIG. 12 is a flow diagram of a design process used in semiconductor design, manufacture, and/or test.

FIG. 12 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 7-11. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 7-11. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 7-11 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 7-11. In one embodiment, design structure 120 may comprise a compiled, executable HDL simulation model that functionally simulates the devices shown in FIGS. 7-11.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 7-11. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure, the method comprising:
    patterning a first portion of a device layer of a semiconductor-on-insulator substrate to form a device region with an exterior sidewall extending to a buried insulator layer of the semiconductor-on-insulator substrate;
    forming a first well of a first conductivity type in the device region; and
    forming a first doped region of a second conductivity type positioned in the first well to define a first junction with a first portion of the first well and such that a second portion of the first well separates the first junction from an exterior sidewall of the device region.

2. The method of claim 1 further comprising:
    forming a second doped region in the first well,
    wherein the second doped region is positioned in the first well between the first junction and the exterior sidewall of the device region, and the second portion of the first well is positioned between the second doped region and the exterior sidewall of the device region.

3. The method of claim 2 wherein the second doped region has the second conductivity type.

4. The method of claim 2 wherein the second doped region has the first conductivity type and a higher dopant concentration than the first well.

5. The method of claim 1 further comprising:
    forming a second well of the second conductivity type in the device region; and
    forming a doped region of the first conductivity type in the second well that defines a second junction with a portion of the second well,
    wherein the portion of the second well is juxtaposed with the first portion of the first well to define a third junction, and the first doped region of the second conductivity type, the first portion of the first well, the portion of the second well, and the doped region of the first conductivity type define a planar silicon controlled rectifier as the device structure.

6. The method of claim 1 further comprising:
    forming a second doped region of the second conductivity type in the first well,
    wherein the first doped region, the first portion of the first well, and the second doped region define a lateral bipolar junction transistor as the device structure.

7. The method of claim 1 wherein the first portion of the first well and the first doped region define a planar diode as the device structure.

8. The method of claim 1 further comprising:
    patterning a second portion of the device layer to form at least one fin for a fin-type field-effect transistor.

9. The method of claim 8 further comprising:
    patterning a conductor layer to form a gate of the fin-type field-effect transistor and a mask on a top surface of the device region that overlies the second portion of the first well.

10. The method of claim 8 further comprising:
    removing a third portion of the device layer laterally between the at least one fin and the device region so that the buried insulator layer electrically isolates the device region from the at least one fin.

11. The method of claim 1 further comprising:
    before the first doped region is formed, epitaxially growing a semiconductor layer on a top surface of the device region that is concurrently doped with a portion of the device region to form the first doped region.

12. A device structure fabricated using a semiconductor-on-insulator substrate with a buried insulator layer and a device layer on the buried insulator layer, the device structure comprising:
    a device region comprised of a first portion of the device layer, the device region having an exterior sidewall extending to the buried insulator layer;
    a first well of a first conductivity type in the device region; and
    a first doped region of a second conductivity type in the first well, the first doped region and a first portion of the first well defining a first junction, and a second portion of the first well positioned between the first doped region and the exterior sidewall of the device region.

13. The device structure of claim 12 further comprising:
    a second doped region in the first well, the second doped region positioned between the first junction and the exterior sidewall of the device region, and the second portion of the first well positioned between the second doped region and the exterior sidewall of the device region.

14. The device structure of claim 13 wherein the second doped region has the second conductivity type.

15. The device structure of claim 13 wherein the second doped region has the first conductivity type and a higher dopant concentration than the first well.

16. The device structure of claim 12 further comprising:
    a second well of the second conductivity type in the device region; and
    a doped region of the first conductivity type in the second well, the first doped region and a portion of the second well defining a second junction,
    wherein the portion of the second well is juxtaposed with the first portion of the first well to define a third junction, and the first doped region of the second conductivity type, the first portion of the first well, the portion of the second well, and the doped region of the first conductivity type define a planar silicon controlled rectifier.

17. The device structure of claim 12 further comprising:
a second doped region of the second conductivity type in the first well,
wherein the first doped region, the first portion of the first well, and the second doped region define a lateral bipolar junction transistor.

18. The device structure of claim 12 wherein the first portion of the first well and the first doped region define a planar diode.

19. The device structure of claim 12 further comprising:
a fin-type field-effect transistor including at least one fin comprised of a second portion of the device layer.

20. The device structure of claim 19 wherein the device region and the at least one fin each have a bottom surface that directly contacts the buried insulator layer, and the device layer is absent between the device region and the at least one fin so that the buried insulator layer electrically isolates the device region from the at least one fin.

21. The device structure of claim 12 wherein the device region has a top surface, and the first doped region includes an additive layer of a semiconductor material applied to the top surface of the device region.

22. The device structure of claim 12 wherein the second portion of the first well is coextensive with the exterior sidewall of the device region.

23. An electrostatic discharge protection circuit comprising:
the device structure of claim 12;
a protected integrated circuit;
a ground pad; and
an input/output pad coupled with the protected integrated circuit,
wherein the device structure is coupled between the input/output pad and the ground pad.

* * * * *